(12) United States Patent
Ide et al.

(10) Patent No.: US 9,553,214 B2
(45) Date of Patent: Jan. 24, 2017

(54) POSITIONING METHOD OF PHOTOELECTRIC CONVERSION DEVICE, AND LIQUID EJECTING APPARATUS

(71) Applicant: SEIKO EPSON CORPORATION, Tokyo (JP)

(72) Inventors: Mitsutaka Ide, Shiojiri (JP); Hideyuki Kataoka, Shiojiri (JP); Hiroyuki Kobayashi, Shimosuwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/666,932

(22) Filed: Mar. 24, 2015

(65) Prior Publication Data

US 2015/0273869 A1    Oct. 1, 2015

(30) Foreign Application Priority Data

Mar. 31, 2014    (JP) .................................. 2014-071239

(51) Int. Cl.
*G03F 7/20* (2006.01)
*H01L 31/02* (2006.01)
*H01L 31/0232* (2014.01)
*B41J 11/00* (2006.01)

(52) U.S. Cl.
CPC ...... *H01L 31/02016* (2013.01); *B41J 11/0095* (2013.01); *H01L 31/02327* (2013.01)

(58) Field of Classification Search
CPC ....................................... G03F 7/705

USPC .............. 347/14, 16, 19; 235/472.01, 462.42
See application file for complete search history.

(56) References Cited

U.S. PATENT DOCUMENTS

| | | | |
|---|---|---|---|
| 5,756,981 A * | 5/1998 | Roustaei | G03F 7/705 235/462.07 |
| 6,585,341 B1 * | 7/2003 | Walker et al. | 347/14 |
| 8,864,271 B2 | 10/2014 | Abe | |
| 2011/0186639 A1 * | 8/2011 | Kearney | 235/472.01 |

FOREIGN PATENT DOCUMENTS

JP    2013-016716    1/2013
JP    2013-119439    6/2013

* cited by examiner

*Primary Examiner* — Lam Nguyen
(74) *Attorney, Agent, or Firm* — Workman Nydegger

(57) ABSTRACT

A positioning method of a photoelectric conversion device (an imaging device) includes irradiating an optical member with light and receiving light which passes through an opening of a light shielding member and the optical member with the photoelectric conversion device. The photoelectric conversion device is moved in a direction orthogonal to an optical axis of the optical member and a first position at which the photoelectric conversion device detects a side of an opening and a second position at which the photoelectric conversion device detects another side opposing the side are acquired. A position of the photoelectric conversion device at which a center of the opening and a center position of the photoelectric conversion device are aligned based on the first position and the second position is determined. The photoelectric conversion device is fixed at the determined position.

1 Claim, 6 Drawing Sheets

POSITIONING METHOD OF PHOTOELECTRIC CONVERSION DEVICE, AND LIQUID EJECTING APPARATUS

The present application claims priority to Japanese Patent Application No. 2014-071239 filed on Mar. 31, 2014, which is hereby incorporated by reference in its entirety.

BACKGROUND

1. Technical Field

Embodiments of present invention relate to method for positioning a photoelectric conversion device, and a liquid ejecting apparatus that includes a photoelectric conversion device.

2. Related Art

An ink jet printer is known as an example of the liquid ejecting apparatus. The printer forms an image on paper by ejecting a printing liquid onto the paper. The printing liquid is an example of a liquid that is ejected from a liquid ejecting unit onto the paper. The printer includes a transport unit and the paper is an example of a medium which is transported a predetermined movement amount by a transport roller of the transport unit. Accordingly, the image in the transport direction of the paper is influenced by the precision of the movement amount of the paper or the precision with which the medium or paper is transported.

A printer may include a detection unit which detects the movement amount of the paper, and a transport control unit. An adjustment is performed by the transport control unit controlling the transporting of the paper based on a detection result of the detection unit such that the movement amount of the paper is a predetermined value. JP-A-2013-119439 discloses an example of such a printer. The detection unit included in the printer of JP-A-2013-119439 is provided with a light emitting unit which emits light that irradiates a rear surface of the paper, an optical member such as a lens which focuses the light which is reflected from the rear surface of the paper, and an imaging unit in which an imaging device is housed in a case. The imaging device acquires a paper surface pattern of the rear surface of the paper based on the light that is focused by the optical member.

The case of the imaging unit is generally formed integrally with a lens barrel member which houses the optical member and the imaging device, and a housing portion which houses the light emitting unit. The imaging unit is provided with transparent glass on a distal end of the housing portion. The transparent glass is disposed such that the center thereof is aligned with the optical axis of the optical member. The housing portion is attached to a medium supporting portion of the printer such that the detection window which is formed in the medium supporting portion is aligned with the transparent glass. The detection unit detects the movement amount of the paper based on the paper surface pattern of the rear surface of the paper which the imaging unit acquires an image of. In other words, movement amount of the paper detected by the detection unit is based on the image of the rear surface of the paper.

However, the precision of the image that is acquired by the imaging device that is housed in the lens barrel member is reduced by stray light. Stray light is generated light that is scattered at the inside wall of the lens barrel member and at the edge of the lens. In a positioning step of the imaging device in which the center position of the imaging device is aligned to the optical axis of the optical member based on an output signal of the imaging device, which is output according to the light with which the imaging device is irradiated, there is a concern that misalignment will increase when the precision of the image that is acquired by the imaging device is reduced. The scattered light can reduce the precision with which the image is acquired.

When the precision of the image that is acquired by the imaging device of the imaging unit is reduced or is deteriorated, for example by scattered light, there is a concern that the precision of the movement amount of the paper detected by the detection unit will be reduced. Note that, because the imaging unit that is mounted to the printer of JP-A-2013-119439 is not particularly made in consideration of the precision of the image that is acquired by the imaging device being reduced due to stray light in this manner, the imaging unit is considered to include the same problem as that described above.

SUMMARY

Embodiments of the invention relate to a method for positioning a photoelectric conversion device, and to a liquid ejecting apparatus in which the precision of an image to be acquired is not easily reduced or compromised.

Hereinafter, embodiments of the invention and operation effects thereof will be described.

A photoelectric conversion device positioning method in a photoelectric conversion unit is disclosed. The photoelectric conversion unit may include an optical member, a photoelectric conversion device, and a light shielding member in which a rectangular opening is formed. A center of the rectangular opening is aligned with an optical axis of the optical member. The method for positioning the photoelectric conversion unit may include irradiating the optical member with light, receiving light that passes through the opening of the light shielding member and the optical member with the photoelectric conversion device, moving the photoelectric conversion device in a direction orthogonal to the optical axis of the optical member and acquiring a first position at which the photoelectric conversion device detects a side of the opening and a second position at which the photoelectric conversion device detects a second side opposing the first side, calculating a position of the photoelectric conversion device at which the center position of the photoelectric conversion device in a direction orthogonal to the optical axis is aligned with the center of the opening in the light shielding device based on the first position and the second position which are acquired, and fixing the photoelectric conversion device in a position at which the center position of the photoelectric conversion device in the direction orthogonal to the optical axis is aligned with the center of the opening in the light shielding device.

According to the method for positioning the photoelectric conversion device, of the light that is radiated onto the optical member, the light that passes through the opening of the light shielding member and the optical member is radiated toward the photoelectric conversion device. Therefore, the shape of the irradiation region of the light that is radiated toward the photoelectric conversion device is a rectangle similar to the opening of the light shielding member. Therefore, the sides of the rectangle of the irradiation region of the light correspond to the sides of the opening of the light shielding member.

The position of the photoelectric conversion device at which the photoelectric conversion device detects a side of the opening of the light shielding member and another side opposing the side is acquired by moving the photoelectric conversion device in a direction orthogonal to the optical axis of the optical member and detecting the sides of the rectangle of the irradiation region of the light corresponding to the sides of the opening of the light shielding member. Therefore, in comparison with a case in which the irradiation region of the light is circular, the photoelectric conversion device can easily detect the sides of the opening of the light shielding member. In relation to the position of the photoelectric conversion device, the position at which the center position of the optical member in a direction orthogonal to the optical axis is aligned with the center of the rectangular opening of the light shielding member is calculated precisely. Therefore, if the photoelectric conversion device is positioned in such a position such that a center of the photo conversion device is aligned with the center of the opening in the light shielding member, the precision of the acquired image is not easily reduced.

An embodiments of a liquid ejecting apparatus may include a transport unit which transports a medium, a liquid ejecting unit which ejects a liquid onto the medium, an imaging unit which images the medium which is transported by the transport unit, and a control unit which controls a transport amount of the medium by the transport unit based on imaging information acquired by the imaging unit. The imaging unit includes a light emitting unit which radiates light toward the medium, an optical member which focuses light that is reflected from the medium, a light shielding member in which a rectangular opening is formed, a center of which is aligned with an optical axis of the optical member, an imaging device which acquires an image based on light which passes through the opening and the optical member, and a lens barrel member which supports the optical member and the light shielding member on an inside of the lens barrel.

According to embodiments of the liquid ejecting apparatus, the light shielding member can suppress light from passing through the light shielding member except at the opening formed therein. Desired light passes through the opening of the light shielding member. Therefore, the stray light caused by scattering or the like of light on the inside wall of the lens barrel is suppressed from passing through the opening of the light shielding member. The light shielding member can effectively block the interior of the lens barrel except for the area associated with the opening in the light shielding member. As a result, the body of the light shielding member can block, absorb or otherwise suppress stray light. As a result, the imaging device receives light in which the stray light has been suppressed. In other words, the imaging device receives less light and scattered light is suppressed from reaching the imaging device by the light shielding member or by a portion or body of the light shielding member. Therefore, the precision of the image that is acquired by the imaging device is not easily reduced or deteriorated.

In embodiments of the liquid ejecting apparatus, the light shielding member may be formed of a material capable of absorbing light.

According to embodiments of the liquid ejecting apparatus, the stray light caused by scattering or the like of the light impinging on the inside wall of the lens barrel is suppressed from passing through the opening of the light shielding member due to a portion or body of the light shielding member (except for the opening of the light shielding member) absorbing the light that is radiated on the portion or body of the light shielding member. Therefore, the precision of the image that is acquired by the imaging device is further not easily reduced or deteriorated.

In embodiments of the liquid ejecting apparatus, the surface of the light shielding member may be black.

According to embodiments of the liquid ejecting apparatus, the surface of the light shielding member may be sprayed or the like with dye. The light absorbing properties of the light shielding member may be due to being black because of being sprayed or the like with dye. Therefore, it is possible to suppress the stray light with a simple configuration.

In embodiments of the liquid ejecting apparatus, the light shielding member may be disposed between the light emitting unit and the optical member.

According to embodiments of the liquid ejecting apparatus, in addition to the scattering of light by the inside wall of the lens barrel, the stray light caused by scattering or the like is suppressed from passing through the opening of the light shielding member. Therefore, stray light is suppressed while desired light passes through the opening, and the image that is acquired by the imaging device becomes more stable and the determination of the movement amount is more reliable.

BRIEF DESCRIPTION OF THE DRAWINGS

Embodiments of the invention will be described with reference to the accompanying drawings, wherein like numbers reference like elements.

FIG. 4A is a cross sectional diagram of the objective lens and the light shielding member, and FIG. 4B is a plan view of the light shielding member.

FIG. 8A is an explanatory diagram of a first position of the imaging device, FIG. 8B is an explanatory diagram of a second position of the imaging device, FIG. 8C is an explanatory diagram of a third position of the imaging device, and FIG. 8D is an explanatory diagram of a center position of the imaging device.

DESCRIPTION OF EXEMPLARY EMBODIMENTS

Hereinafter, description will be given of an ink jet printer, which is an example of a liquid ejecting apparatus, with reference to the drawings.

Figure 1:
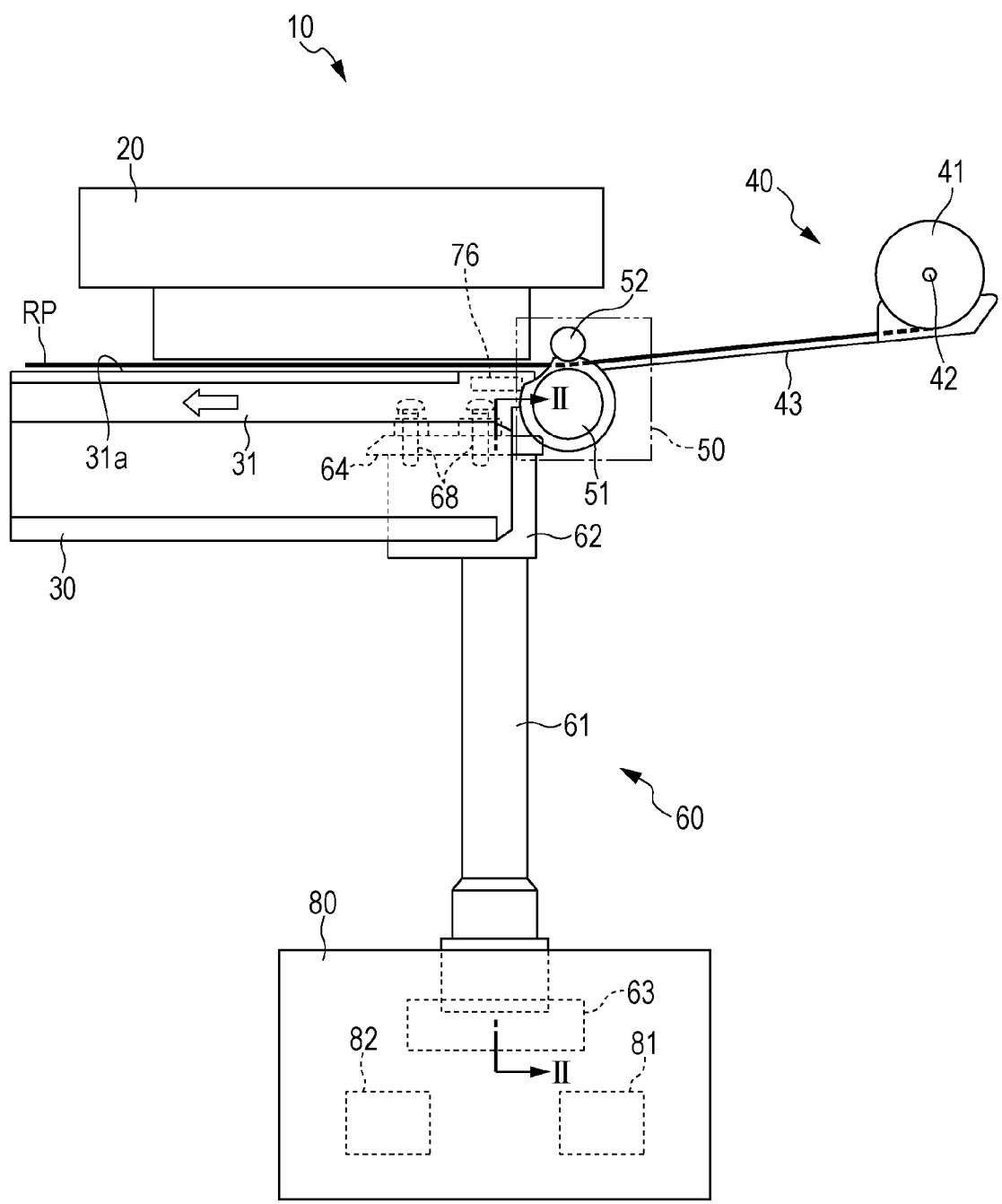
FIG. 1 is a profile diagram of an embodiments of a liquid ejecting apparatus.

As illustrated in FIG. 1, a printer 10 may include a printing liquid ejecting unit 20 which serves as the liquid ejecting unit, a base section 30, a paper supply unit 40, a transport unit 50, an imaging unit 60, and a transport control unit 80 which serves as the control unit. The base section 30 may include a medium supporting portion 31 on the side opposing the printing liquid ejecting unit 20. The paper supply unit 40 may include a paper holding portion 41, a roll shaft 42, and a paper case 43. The paper holding portion 41 holds long-sheet shaped paper RP, which is an example of a medium which is wound around the roll shaft 42 in a roll shape. The paper case 43 forms a transport path which guides the paper RP, which is unwound and fed out from the roll state by the roll shaft 42 rotating, to the transport unit 50. The paper supply unit 40 supplies the paper RP that is fed out from the paper holding portion 41 to the transport unit 50 via the paper case 43.

The transport unit 50 may include a transport roller 51, a paper retention roller 52, and a transport motor (not shown). The transport unit 50 is disposed between the base section 30 and the paper supply unit 40. Together with the paper retention roller 52, the transport roller 51 pinches the paper RP that is fed out from the paper holding portion 41. Due to the transport roller 51 being driven by the transport motor, the transport unit 50 transports the paper RP along a medium support surface 31a of the medium supporting portion 31 in the direction indicated by the white arrow.

The printing liquid ejecting unit 20 forms an image on the printing surface of the paper RP by ejecting the printing liquid onto the paper RP that is transported along the medium support surface 31a.

A detection window (not shown) is formed in the medium support surface 31a of the medium supporting portion 31 in the proximity of the transport unit 50.

The imaging unit 60 may include a lens barrel member 61, a housing portion 62, an imaging section 63, and a shielding member 64. The lens barrel member 61, the housing portion 62, and the imaging section 63 may be formed integrally using a synthetic resin such as plastic, for example. The imaging unit 60 may include a transparent glass 76 on the distal end of the housing portion 62 or on the side near the medium supporting portion 31. In the distal end portion of the housing portion 62, the shielding member 64 shields the light from portions except for the transparent glass 76 such that the light does not enter the housing portion 62 except through the transparent glass 76. The imaging unit 60 is attached to the medium supporting portion 31 by attachment screws 68 such that the transparent glass 76 can be aligned with the detection window that is formed in the medium support surface 31a of the medium supporting portion 31. Therefore, the imaging unit 60 is attached to the medium supporting portion 31 in a state of being disposed in a position on the opposite side of the printing unit relative to the paper RP. The imaging unit 60 images the paper surface pattern of the rear surface of the paper RP that is transported along the medium support surface 31a of the medium supporting portion 31 through the detection window of the medium support surface 31a at a fixed time interval. In other words, the imaging unit 60 captures one or more images for the rear surface of the paper RP and the images may be captured or imaged at fixed intervals.

The transport control unit 80 may include a computation block 81 and a control block 82. The computation block 81 calculates the movement amount of the paper RP for each fixed time interval based on the paper surface pattern of the rear surface of the paper RP that is imaged by the imaging unit 60 at a fixed time interval. The movement amount may be based on more than one image of the rear surface. For example, the computation block 81 calculates the movement amount of the paper RP for each fixed interval based on the paper surface pattern that is acquired by the n-th imaging. The computation block 81 may also calculates the shifting amount of the position of the paper surface pattern that is acquired by the (n+1)-th imaging after a fixed time has elapsed. The control block 82 stores transport speed data of the paper RP corresponding to the type of the print image data that is supplied from the printer 10. The control block 82 performs control such that the transport speed of the paper RP assumes a value that is determined in advance by changing the transport amount of the paper by controlling the transport motor of the transport unit 50 based on the movement amount of the paper RP that is calculated by the computation block 81.

Next, a description will be given of the internal configuration of the imaging unit 60, with reference to FIG. 2.

A light emitting unit 75 is fixed to the inside wall of the housing portion 62 at an angle at which it is possible to radiate light toward the transparent glass 76. The light emitting unit 75 is provided with a light emitting diode which serves as the light source, for example. The optical member 70 and the light shielding member 74 are disposed inside the lens barrel member 61. The light shielding member 74 is disposed between the light emitting unit 75 and an objective lens 71. An opening 79, the center of which is aligned with an optical axis OA of the optical member 70, is formed in the light shielding member 74. The light shielding member 74 is formed of a black material which absorbs light in some embodiments.

The optical member 70 may include the objective lens 71, an ocular lens 72, and an aperture 73. The light which is radiated from the light emitting unit 75 and is transmitted through the transparent glass 76 to the rear surface of the paper RP is reflected by the rear surface of the paper RP. After being reflected by the rear surface, the reflected light passes through the transparent glass 76 again. The reflected light that is incident on the lens barrel member 61 is focused by passing through the objective lens 71 and the ocular lens 72. Some of the stray light or scattered light is either blocked or absorbed by the light shielding member.

A supporting substrate 78, on which an imaging device 77 that serves as the photoelectric conversion device is mounted, is attached to the bottom end portion of the imaging section 63. The light reflected from the rear surface of the paper RP which passes through the opening 79 of the light shielding unit 74 is focused by the objected lens 71 and the ocular lens 72 on the imaging device 77. By focusing the light in this manner, an image is formed on surface of the imaging device 77 and the imaging device 77 acquires the paper surface pattern of the rear surface of the paper RP. A planoconvex telecentric lens is an example of the objective lens 71 and of the ocular lens 72. A two-dimensional image sensor is an example of the imaging device 77.

Figure 2:
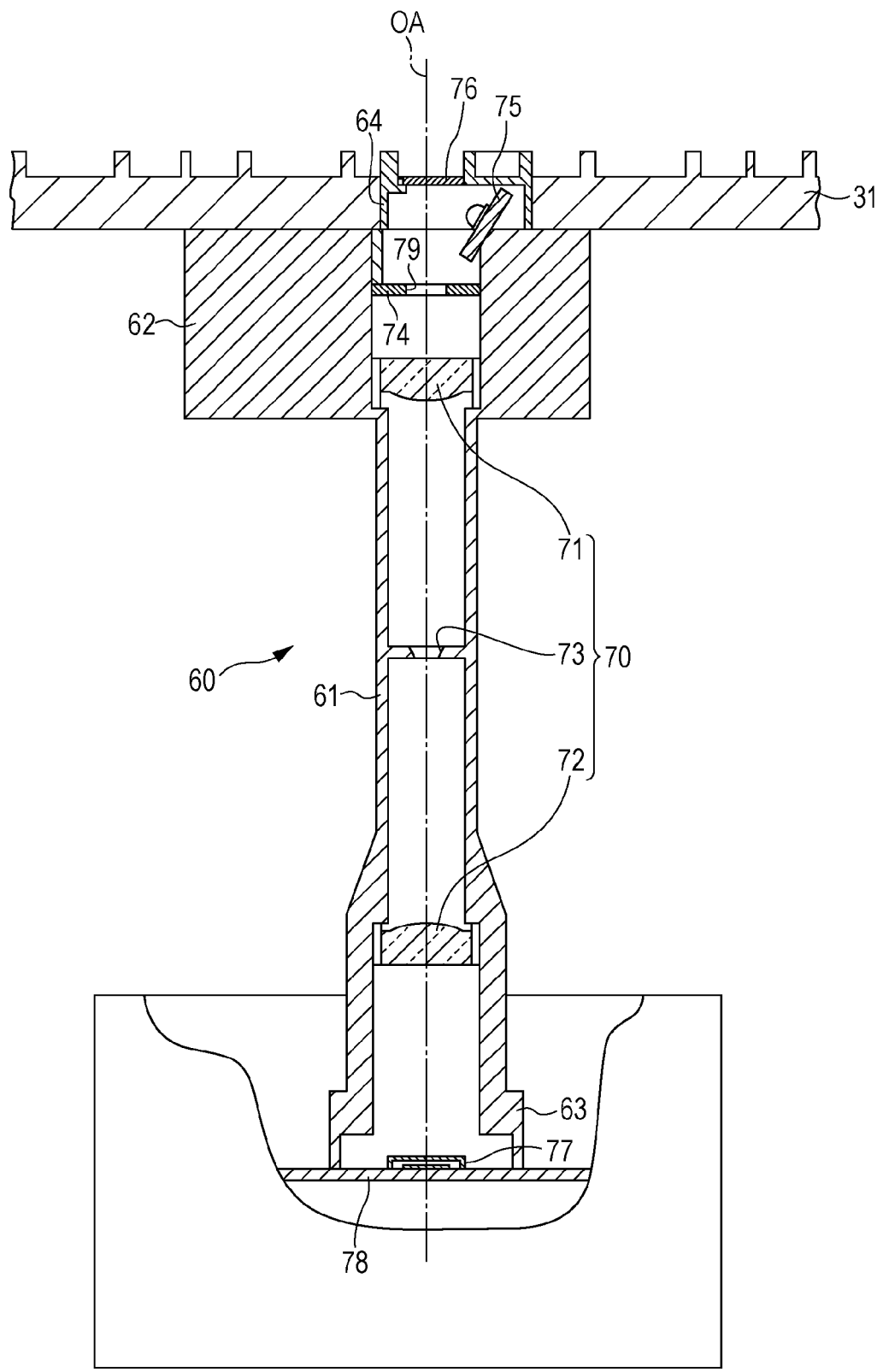
FIG. 2 is a diagram illustrating a cross sectional structure of an embodiment of an imaging unit, taken along the line II-II.
Figure 3:
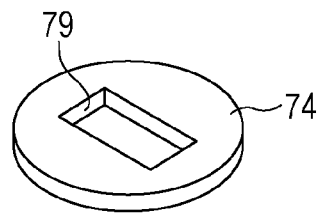
FIG. 3 is a perspective diagram of an embodiment of the light shielding member.

As illustrated in FIG. 3, the opening 79 of the light shielding member 74 is formed in a rectangular shape similar to that of the imaging device 77 (refer to FIG. 2).

Next, with reference to FIGS. 4A and 4B, description will be given of the relationship between the disposition of the light shielding member 74 in the lens barrel member 61 and the size of the opening 79.

Figure 4A:
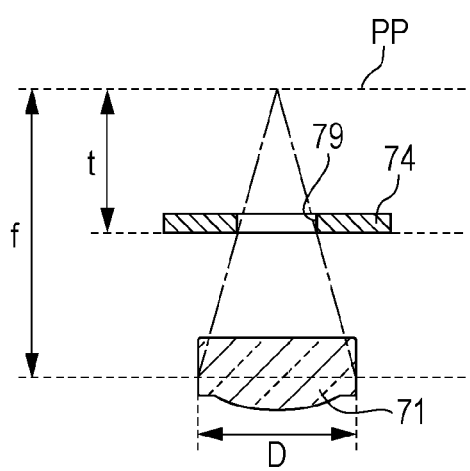
FIGS. 4A and 4B illustrate an embodiment of the light shielding member and an objective lens.

FIG. 4A illustrates the disposition of the light shielding member 74 and the objective lens 71 in relation to the rear surface of the paper RP illustrated in FIG. 1.

The objective lens 71 is disposed in a position at which the distance from an imaging surface PP which corresponds to the position of the rear surface of the paper RP is equal to a focal length f of the objective lens 71. The light shielding member 74 is disposed in a position at which the imaging surface PP is closer than the objective lens 71 in one example.

Figure 4B:
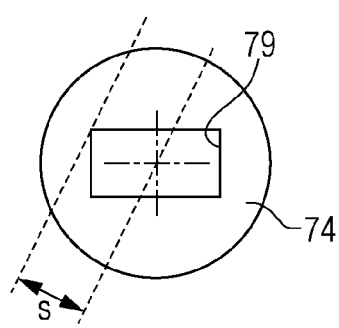

The opening 79 that is formed in the light shielding member 74 is formed such that the length "s" from the center of the rectangle to the vertex of the rectangle illustrated in FIG. 4B assumes a value that is obtained based on the following expression (1).

$$S \leq t \times \tan\left(\tan^{-1}\frac{D}{2f}\right) \quad (1)$$

The term "f" indicates the focal length of the objective lens 71. The term "D" indicates the effective aperture of the objective lens 71. The term "t" indicates the distance from the imaging surface PP to the rear surface of the light shielding member 74.

By adopting a disposition of the objective lens 71 and the light shielding member 74, and the shape of the opening 79 based on the expression (1), the imaging unit 60 suppresses light from being scattered at the end portions of the objective lens 71 by allowing the light which does not spread wider than the effective aperture D of the objective lens 71 to enter the objective lens 71. In one example, the light shielding member 74 is positioned such that light does not reach the end portions of the objective lens 71.

Next, a description will be given of an outline of the manufacturing steps of the imaging unit 60.

In the manufacturing steps of the imaging unit 60, an assembly step of the components except for the supporting substrate 78 and the imaging device 77 is carried out first. Subsequently, a positioning step of the imaging device 77 in which the center position (hereinafter the center position in a direction orthogonal to the optical axis OA of the optical member 70 will be referred to as the "center position") of the imaging device 77 in a direction orthogonal to the optical axis OA of the optical member 70 is aligned with the optical axis OA of the optical member 70 that is disposed in the lens barrel member 61 is carried out. The entirety of the imaging unit 60 is completed by carrying out an attachment step in which the supporting substrate 78 onto which the imaging device 77 is mounted is attached to the bottom end portion of the imaging section 63. The imaging device 77 is thus fixed to other portions of the imaging unit 60 after being aligned in one example.

Next, description will be given of the configuration of the position adjustment jig 90 used in the positioning of the imaging device 77, with reference to FIG. 5.

The position adjustment jig 90 may include an imaging unit fixing section 91, an adjustment light source unit 92, a moving stage 93, and a storage unit (not shown). The adjustment light source unit 92 is disposed on the top portion of the imaging unit fixing section 91. The adjustment light source unit 92 is provided with an adjustment light source (not shown) using a light-emitting diode, for example, which radiates light into the inner portion of the imaging unit 60.

The moving stage 93 includes a mounting surface 93a which is in a distanced position from or separated from the imaging unit fixing section 91. The moving stage 93 opposes the imaging unit fixing section 91. The moving stage 93 includes a configuration capable of moving in the illustrated X direction, Y direction (refer to FIG. 7), and Z direction.

The storage unit stores information that is acquired by the position adjustment jig and is necessary to hold or store for use in computation, for example in computing where the imaging device 77 should be positioned.

Next, a description will be given of an embodiment of the imaging unit 60 that is attached to the position adjustment jig 90.

The imaging unit 60 is fixed to the imaging unit fixing section 91 so as to be positioned such that the light that is emitted by the adjustment light source unit 92 passes through the transparent glass 76 (refer to FIG. 2), or, such that the optical axis OA of the optical member 70 runs along the Z direction. Therefore, the X direction and the Y direction are directions orthogonal to the optical axis OA of the optical member 70. The light emitted by the adjustment light source unit 92 passes through the transparent glass 76 and irradiates the light shielding member 74 and the optical member 70.

The imaging device 77 that is mounted on the supporting substrate 78 is disposed on the mounting surface 93a of the moving stage 93 in a state of being distanced from or separated from the imaging section 63. The imaging device 77 of the mounting surface 93a receives the radiated light of the adjustment light source unit 92 that passes through the light shielding member 74 and the optical member 70. The imaging device 77 that is disposed on the mounting surface 93a moves in the X direction, the Y direction, and the Z direction in relation to the imaging unit 60 due to the moving stage 93 moving. Thus, the imaging device 77, at least when disposed on the mounting surface 93a can be moved in the X, Y, and Z directions relative to the optical member 70.

A description will be given of the positioning method of the imaging device 77, with reference to FIGS. 6 to 8D.

Figure 6:
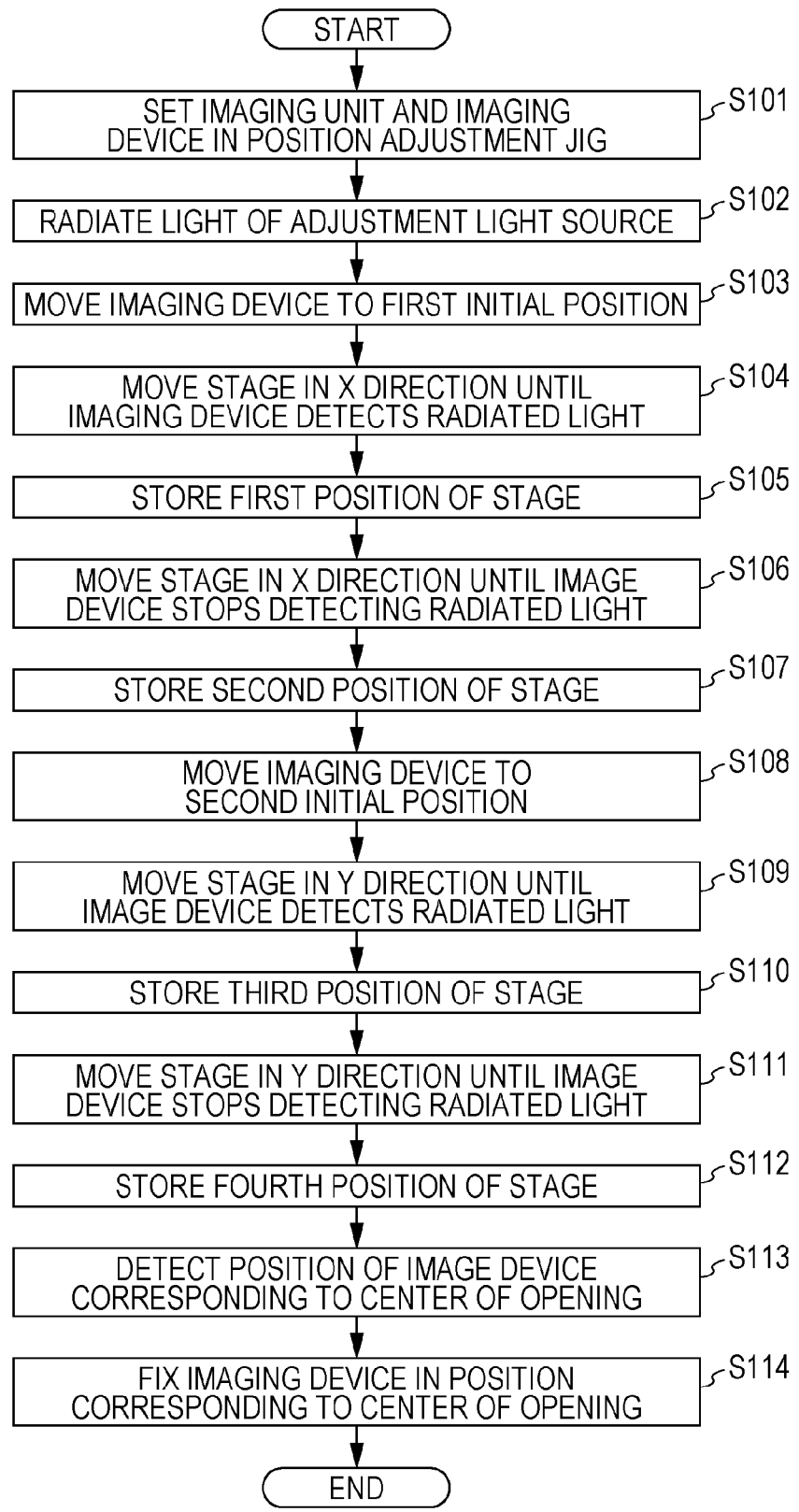
FIG. 6 is an illustrative example of a flowchart of a method for positioning of a photoelectric conversion device.

FIG. 6 illustrates a flowchart of a case in which the positioning of the imaging device 77 is performed. A worker (or device) sequentially executes each step illustrated in FIG. 6 when performing the positioning of the imaging device 77.

Figure 5:
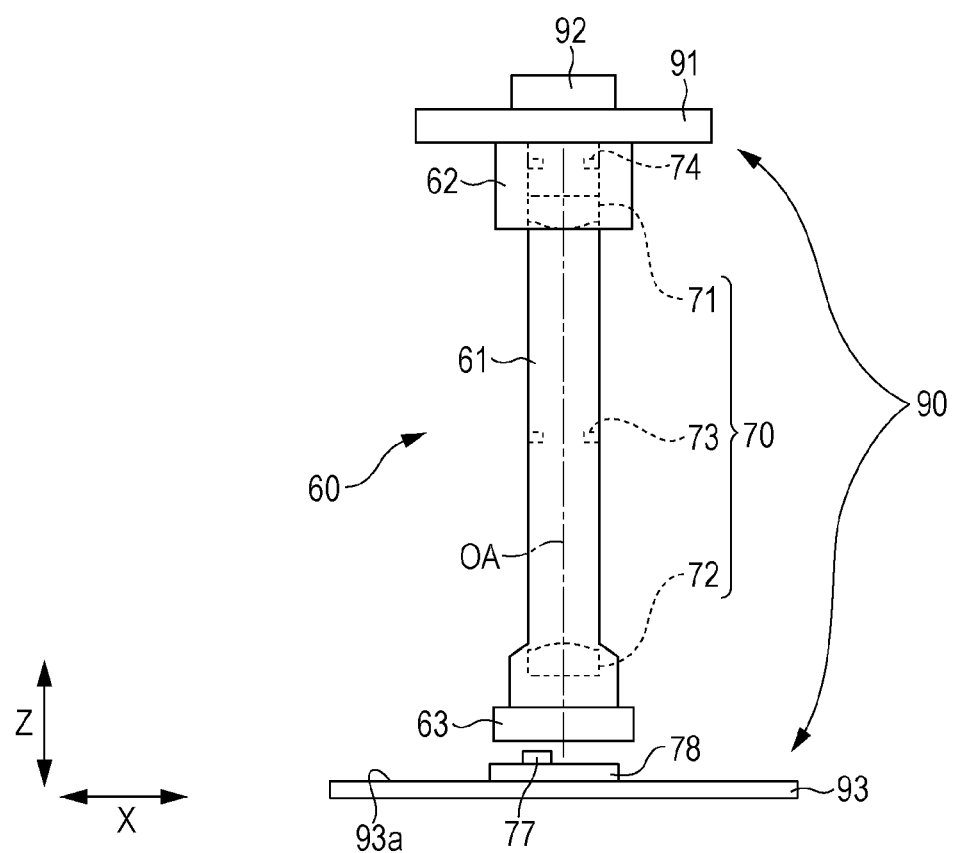
FIG. 5 is a schematic diagram of an example configuration of the imaging unit and a position adjustment jig in a manufacturing process of the imaging unit.

First, in step S101, as illustrated in FIG. 5, the worker fixes the imaging unit 60 to which the imaging device 77 is yet to be attached to the imaging unit fixing section 91, and sets the imaging device 77 which is mounted on the supporting substrate 78 on the mounting surface 93a of the moving stage 93. Next, in step S102, the worker causes the adjustment light source of the adjustment light source unit 92 to emit light, and allows the light to pass through the transparent glass 76 of the imaging unit 60 illustrated in FIG. 2 and to irradiate the light shielding member 74 and the optical member 70.

Figure 7:
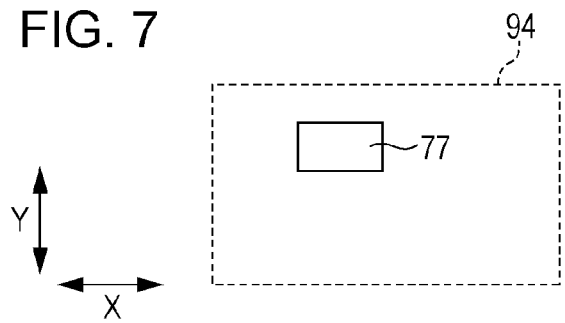
FIG. 7 is an explanatory diagram illustrating an irradiation region and the position of the imaging device.

FIG. 7 illustrates the shape of the irradiation region 94 of the light which irradiates the imaging device 77.

The shape of the irradiation region 94 of the light that passes through the opening 79 of the light shielding member 74 assumes a similar shape to the opening 79 due to the shielding member 74 being irradiated with the light emitted by the adjustment light source unit 92.

FIGS. 8A to 8D illustrate the movement direction of the imaging device 77 and the positional relationship between the imaging device 77 and the irradiation region 94 of the light when the imaging device 77 moves in relation to the irradiation region 94 of the light in the step in which the positioning of the imaging device 77 is performed.

Figure 8A:
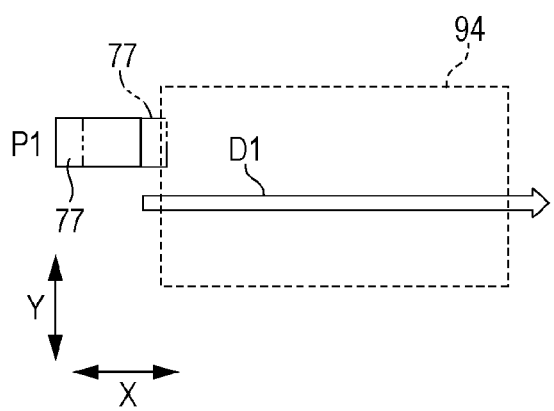
FIGS. 8A to 8D illustrate the irradiation region and the positions of the imaging device of the embodiment.
Figure 8B:
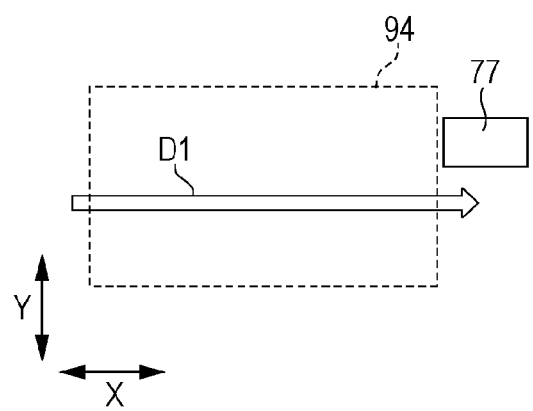

In step S103 illustrated in FIG. 6, the worker moves the moving stage 93 such that the position of the imaging device 77 becomes a first initial position P1 away from or outside of the irradiation region 94 of the light in the X direction, as illustrated by the solid line in FIG. 8A. When the imaging device 77 moves to the position of the first initial position P1, due to no longer being irradiated with the light, a detection signal indicating that light is not detected (hereinafter referred to as the "light undetected signal") is output.

Next, in step S104, the worker moves the moving stage 93 along a first direction D1 indicated by the arrow in FIG. 8A until the imaging device 77 starts detecting irradiated light and the output signal changes to a signal indicating that the light is detected (hereinafter referred to as the "light detected signal"). When the imaging device 77 moves to the position indicated by the double-dot-dash line in FIG. 8A in which a portion thereof enters the irradiation region 94 of the light, the output signal changes from the light undetected signal to the light detected signal. In other words, when the imaging device 77 detects a side of the rectangle of the irradiation region 94 of the light in the X direction, the output signal of the imaging device 77 changes from the light undetected signal to the light detected signal. Here, the sides of the rectangle of the irradiation region 94 correspond to the sides of the opening 79 due to the shape of the irradiation region 94 being similar to that of the opening 79 of the light shielding member 74.

Subsequently, in step S105, the worker causes the storage unit to store the position of the moving stage 93 in the X direction as a first position at which the imaging device 77 detects a side of the rectangle of the opening 79 in the X direction.

Next, in step S106, the worker moves the moving stage 93 along the first direction D1 of the X direction until the imaging device 77 no longer detects the light with which the irradiation region 94 of the light is irradiated, and the output signal of the imaging device 77 changes from the light detected signal to the light undetected signal. The output signal of the imaging device 77 changes to the light undetected signal when the imaging device 77 moves to a position away from or outside of the irradiation region 94 of the light illustrated in FIG. 8B. In other words, when the imaging device 77 detects another or second side opposing the side of the rectangle of the opening 79 in the X direction, the output signal of the imaging device 77 changes from the light undetected signal to the light detected signal. Subsequently, in step S107, the worker causes the storage unit to store the position of the moving stage 93 in the X direction as a second position at which the imaging device 77 detects another or second side opposing the first side of the irradiation region 94 in the X direction. Thus, two opposing sides of the irradiation region 94 (or of the opening 79) have been detected.

Figure 8C:
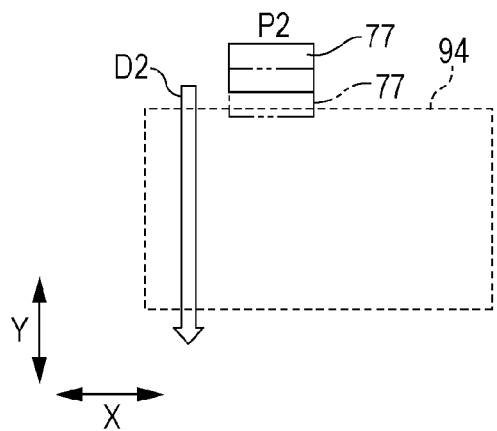

Next, in step S108, the worker moves the moving stage 93 such that the position of the imaging device 77 becomes a second initial position P2 away from or outside of the irradiation region 94 of the light in the Y direction, as illustrated in FIG. 8C. The imaging device 77 outputs the light undetected signal when moved to the second initial position P2.

Next, in step S109, the worker moves the moving stage 93 along a second direction D2 indicated by the arrow in FIG. 8C until the imaging device 77 starts detecting irradiated light and the output signal changes to the light detected signal. When the imaging device 77 moves to the position indicated by the double-dot-dash line in FIG. 8C in which a portion thereof enters the irradiation region 94 of the light, the output signal changes from the light undetected signal to the light detected signal. Subsequently, in step S110, the worker causes the storage unit to store the position of the moving stage 93 in the Y direction as a third position at which the imaging device 77 detects a side of the rectangle of the opening 79 or of the irradiation region in the Y direction.

Next, in step S111, the worker further moves the moving stage 93 along the second direction D2 until the output signal of the imaging device 77 changes to the light undetected signal. In step S112, the worker causes the storage unit to store the position of the moving stage 93 in the Y direction, which is the position at which the output signal of the imaging device 77 changes to the light undetected signal, as a fourth position at which the imaging device 77 detects another side opposing the side of the rectangle of the opening 79 in the Y direction. This illustrates and example of how the four sides of the opening 79 or of the irradiation region 94 can be located.

Next, in step S113, the worker calculates the position of the imaging device 77 at which the center position of the imaging device 77 in the X direction is aligned with a center line C11 (refer to FIG. 8D) of the irradiation region 94 in the X direction based on the first position and the second position of the moving stage 93 stored in the storage unit. The worker calculates the position of the imaging device 77 at which the center position of the imaging device 77 in the Y direction is aligned with a center line C21 (refer to FIG. 8D) of the irradiation region 94 in the Y direction based on the third position and the fourth position of the moving stage 93 stored in the storage unit. Here, the center of the irradiation region 94 corresponds to the center of the opening 79 due to the shape of the irradiation region 94 being similar to the shape of the opening 79 of the light shielding member 74.

Figure 8D:
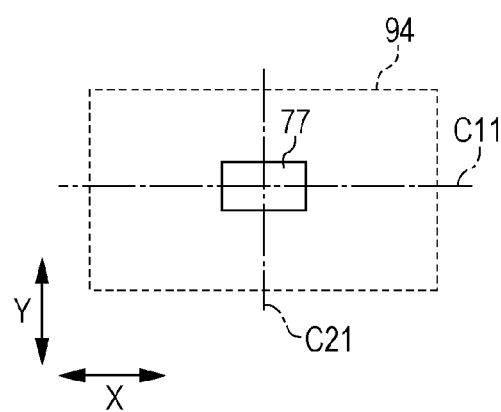

Next, in step S114, the worker moves and fixes the moving stage 93 such that the position of the center position of the imaging device 77 is at the center of the irradiation region 94, and is the position indicated in FIG. 8D corresponding to the center of the opening 79 of the light shielding member 74.

The center position of the imaging device 77 is fixed in a position corresponding to the center of the opening 79 of the light shielding member 74 as illustrated in FIG. 8D due to the steps of the flowchart illustrated in FIG. 6 being executed. The worker completes the entirety of the imaging unit 60 by moving the moving stage 93 in the Z direction, which is the direction toward the imaging unit 60, and attaching the imaging device 77, the center position of which is aligned with a position corresponding to the center of the opening 79 of the light shielding member 74, to the bottom end portion of the imaging section 63.

According to the embodiments described above, it is possible to obtain the effects described hereinafter.

(1) In the positioning step of the imaging device 77, the boundary of the irradiation region 94 is formed by the sides of the rectangle due to the shape of the irradiation region 94 of the light that is radiated toward the imaging device 77 being a rectangle of a shape similar to that of the opening 79 of the light shielding member 74. Therefore, in comparison to a case in which the irradiation region is circular, the precision with which it is possible to detect that the imaging device 77 is positioned at the boundary of the irradiation region 94 is improved. Therefore, the position of the imaging device 77 at which the center position is aligned with the center of the opening 79 is calculated precisely. Accordingly, the precision with which the center position of the imaging device 77 is aligned with the optical axis OA of the optical member 70 is improved.

(2) In the printer 10, the light which passes through the opening 79 of the light shielding member 74 is restricted by the portion or body of the light shielding member 74 except for the opening 79. Therefore, in comparison to a configuration in which the light shielding member 74 is not provided, it is easy to suppress stray light from passing through the opening 79. Some of the light such as scattered or stray light is blocked or absorbed by the body of the light shielding member 74. Therefore, it is easy to improve the precision of the image that is acquired by the imaging device 77.

(3) The light which passes through the opening 79 of the light shielding member 74 is effectively restricted by the portion or body of the light shielding member 74 except for the opening 79 due to the light absorbed by the light shielding member 74. Therefore, the precision of the image that is acquired by the imaging device 77 is further improved.

(4) Embodiments of the invention suppress the light scattered by the inside wall of the lens barrel member 61, scattering caused by the light emitting unit 75, and light or the light heading from the light emitting unit 75 toward the optical member 70 from passing through the opening 79 of the light shielding member 74. Therefore, stray light is suppressed, and the precision of the image that is acquired by the imaging device 77 is not easily reduced.

(5) The scattering of light at the end portion of the optical member 70 is suppressed due to the suppression of the end portion of the optical member 70 being irradiated by the light that passes through the opening 79 of the light shielding member 74. Therefore, stray light is further suppressed, and the precision of the image that is acquired by the imaging device 77 is further not easily reduced.

The embodiments described above may be modified to form different embodiments as described below.

In the embodiment described above, a configuration may be adopted in which a microcontroller is provided. The microcontroller controls the execution of the steps of the positioning flow of the imaging device 77 illustrated in FIG. 6.

In the embodiment described above, the steps S103 to S107 and the steps S108 to S112 of the positioning flow of the imaging device 77 illustrated in FIG. 6 may be executed in the opposite order. According to this positioning method, the position of the boundary of the irradiation region 94 in the X direction is detected after the position of the boundary in the Y direction is detected. In another example, the method may start with the imaging device 77 being positioned inside the irradiation region 94.

In the embodiment described above, the imaging unit 60 may adopt a configuration in which the light shielding member 74 is disposed between the objective lens 71 and the aperture 73. In this case, the light shielding member 74 suppresses the irradiation of the aperture 73 and the ocular lens 72 with the stray light of the radiated light which passes through the objective lens 71.

In the embodiment described above, the light shielding member 74 may be formed of a material which has a black surface due to being sprayed or the like with dye.

In the embodiment described above, the liquid ejecting apparatus may adopt a configuration in which the imaging unit 60 is disposed above the paper RP which is transported along the medium support surface 31a. In this case, the imaging unit 60 acquires the paper surface pattern of the printing surface of the paper RP.

In the embodiment described above, the liquid ejecting apparatus may adopt a configuration in which the paper supply unit 40 supplies printing paper that is cut to a predetermined size, and the liquid ejecting unit 20 ejects printing liquid onto the printing paper that is cut to the predetermined size.

In the embodiment described above, the liquid ejecting apparatus may adopt a configuration in which a plurality of imaging units are provided, and the imaging units are fixed in or at a plurality of different positions of the medium supporting portion 31. In this case, it is possible to improve the calculation precision of the movement amount by the computation block 81 of the transport control unit 80 calculating the movement amount of the paper RP based on the images acquired from the plurality of imaging units.

In the embodiment described above, the liquid ejecting apparatus may adopt a configuration in which the movement amount of the paper RP is detected using a laser doppler velocimeter instead of a calculation of the movement amount of the paper RP using the imaging unit 60 and the computation block 81. In this case, the laser doppler velocimeter radiates the rear surface of the paper RP with two semiconductor laser beams that are caused to pass or travel through different light paths. The photoelectric conversion device converts the light which is reflected from the rear surface of the paper RP which receives the light via a light receiving lens into an electrical signal. The laser doppler velocimeter detects the movement amount of the paper RP based on the electrical signal that is output by the photoelectric conversion device.

In the embodiment described above, a fluid ejecting apparatus may eject or discharge a fluid other than the printing fluid (including a liquid, a liquid body in which particles of a functional material are dispersed or mixed in a liquid, a fluid body such as a gel, and a solid that can be caused to flow as a fluid and ejected). For example, the fluid ejecting apparatus may be a liquid body ejecting apparatus which ejects a liquid body which contains a material such as an electrode material or a color material (pixel material) in the form of a dispersion or a solution. The electrode material or the color material may be used in the manufacture or the like of liquid crystal displays, electro-luminescence displays, and surface emission displays. The liquid ejecting apparatus may be a liquid ejecting apparatus which ejects biological organic matter used in the manufacture of bio-chips, or a liquid ejecting apparatus which is used as a precision pipette to eject a liquid which serves as a sample. The liquid ejecting apparatus may also be a liquid ejecting apparatus which ejects lubricant at pinpoint precision into precision machines such as clocks and cameras, or a liquid ejecting apparatus which ejects a transparent resin liquid such as ultraviolet curing resin onto a substrate in order to form minute semispherical lenses (optical lenses) used in optical communication devices and the like. The liquid ejecting apparatus may also be a liquid ejecting apparatus which ejects an acidic or alkaline etching liquid for etching a substrate or the like, a fluid body ejecting apparatus which ejects a fluid body such as gel (for example, physical gel), or a powder body ejecting apparatus (for example, a toner jet recording apparatus) which ejects a solid, for example, a powder (particulate matter) such as toner. It is possible to apply the invention to any of these types of the fluid ejecting apparatus. Note that, in the present specification, the term "fluid" is a concept which does not include fluids formed only of a gas, and examples of a fluid include liquid (an inorganic solvent, an organic solvent, a solution, a liquid-state resin, a liquid-state metal (molten metal), and the like), liquid-state bodies, fluid-state bodies, particulate matter (including grains and powders), and the like.

What is claimed is:

1. A photoelectric conversion device positioning method in a photoelectric conversion unit that includes an optical member, a photoelectric conversion device, and a light shielding member in which a rectangular opening is formed, a center of which is aligned with an optical axis of the optical member, the method comprising:

irradiating the optical member with light;

receiving light that passes through the opening of the light shielding member and the optical member with the photoelectric conversion device;

moving the photoelectric conversion device in a direction orthogonal to the optical axis of the optical member and acquiring a first position at which the photoelectric conversion device detects a first side of the opening and a second position at which the photoelectric conversion device detects a second side opposing the first side;

calculating a position of the photoelectric conversion device at which a center position of the photoelectric conversion device in a direction orthogonal to the optical axis is aligned with the center of the opening in the light shielding member based on the first position and the second position which are acquired; and fixing the photoelectric conversion device in a position at which the center position of the photoelectric conversion device in the direction orthogonal to the optical axis is aligned with the center of the opening in the light shielding member.

* * * * *